United States Patent [19]

Yonehara

[11] Patent Number: 4,868,140
[45] Date of Patent: Sep. 19, 1989

[54] SEMICONDUCTOR DEVICE AND METHOD OF MANUFACTURING THE SAME

[75] Inventor: Takao Yonehara, Atsugi, Japan
[73] Assignee: Canon Kabushiki Kaisha, Tokyo, Japan
[21] Appl. No.: 212,088
[22] Filed: Jun. 27, 1988

Related U.S. Application Data

[62] Division of Ser. No. 870,423, Jun. 4, 1986, abandoned.

[30] Foreign Application Priority Data

Jun. 18, 1985 [JP] Japan ................................. 60-130830

[51] Int. Cl.$^4$ ..................... H01L 21/00; H01L 21/02; H01L 21/20; H01L 21/36
[52] U.S. Cl. ..................................... 437/109; 437/84; 437/923; 437/967; 437/233; 437/247; 357/4; 148/DIG. 122
[58] Field of Search ................. 437/109, 84, 923, 967, 437/233, 247; 148/DIG. 122; 357/4

[56] References Cited

U.S. PATENT DOCUMENTS

| | | | |
|---|---|---|---|
| 4,214,918 | 7/1980 | Gat et al. | 437/19 |
| 4,272,880 | 6/1981 | Pashley | 357/59 E |
| 4,514,895 | 5/1985 | Nishimura | 357/59 E |
| 4,557,943 | 12/1985 | Rosler et al. | 427/38 |
| 4,581,814 | 4/1986 | Celler et al. | 437/247 |
| 4,597,160 | 7/1986 | Ipri | 437/84 |
| 4,625,224 | 11/1986 | Nakagawa et al. | 357/4 |
| 4,626,883 | 12/1986 | Kash et al. | 357/60 |
| 4,693,759 | 9/1987 | Noguchi et al. | 437/923 |

FOREIGN PATENT DOCUMENTS 62-008572 1/1987 Japan .

OTHER PUBLICATIONS

Karmins et al, *IEEE Trans. on Elec. Dev.*, vol. Ed-27, No. 1, Jan. 1980, "A Monolithic . . . Polysilicon", pp. 290-293.

Nishimura et al, *Appl. Phys. Lett.,* 1 Jan. 83, "Metal-Oxide-Semiconductor . . . Islands", pp. 102-104.

Kamins, T., A Monolithic Integrated Circuit Fabricated in Laser-Annealed Polysilicon, IEEE Electron Devices, vol. Ed 27, No. 1, Jan. 1980.

Mohammadi, F., A High-Voltage MOSFET in Polycrystalline Silicon, IEEE Electron Devices, vol. Ed. 27, No. 1, Jan. 1980.

Lu, N., The Effect of Film Thickness on the Electrical Properties of LPCVD Polysilicon Films, J. Electrochem. Soc. 131, p. 898, Apr. 1984.

Wolf, S., Silicon Processing for the VLSI Era, Chapters 4 and 6, Lattice Press, 1986.

Ghandhi, S., VLSI Fabrication Principles, Chapter 8, Wiley and Sons, 1983.

Sze, S., VLSI Technology, Chapter 3, McGraw-Hill, 1983.

Hatalis, M., High-Performance Thin-Film Transistors in Low-Temperature Crystallized LPCVD Amorphous Silicon Films, IEEE Electron Device Letters, vol. EDL-8, No. 8, Aug. 1987.

Levinson, J., Conductivity Behavior in Polycrystalline Semiconductor Thin Film Transistors, J. Appl. Phys., vol. 53, No. 2, Feb. 1982.

Primary Examiner—Brian E. Hearn
Assistant Examiner—B. Everhart
Attorney, Agent, or Firm—Fitzpatrick, Cella, Harper & Scinto

[57] ABSTRACT

In a semiconductor device, an active layer is formed on an insulating substrate. The active layer is a polycrystalline semiconductor film having large diameter crystal grain. A carrier mobility of said polycrystalline semiconductor film is not lower than 10 cm$^2$/V·sec.

1 Claim, 3 Drawing Sheets

FIG. I
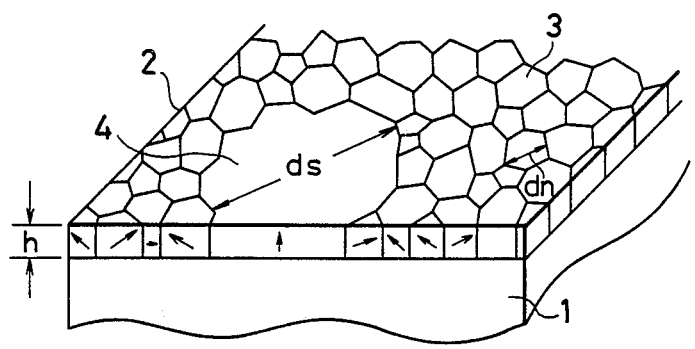
FIG. 2
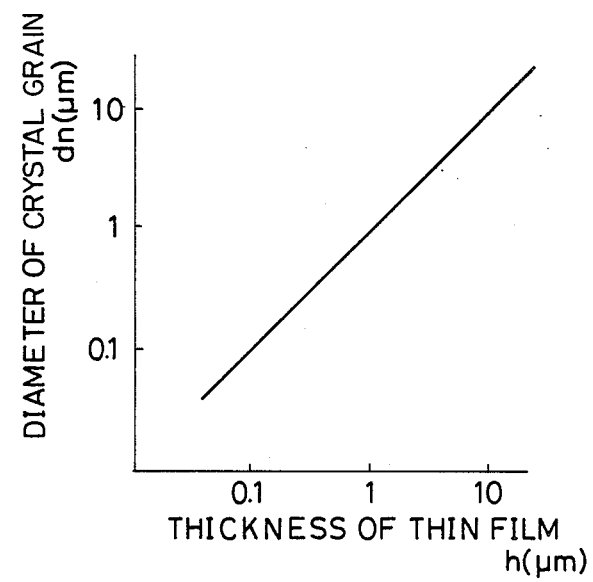

SEMICONDUCTOR DEVICE AND METHOD OF MANUFACTURING THE SAME

This application is a division of application Ser. No. 870,423 filed June 4, 1986 now abandoned.

BACKGROUND OF THE INVENTION

1. Field of the Invention

The present invention relates to a semiconductor device and a method of manufacturing the same and, more particularly, to a semiconductor device in which an active layer is formed on an insulating substrate and to a method of manufacturing this device.

2. Related Background Art

Recently, in association with very large and large scale integration of semiconductor elements, complete electrical isolation among elements and the reduction in stray capacitance are important subjects of consideration. In addition, due to development of a long or large-area image device, making of a long or large-area active element and the like are the significant subjects of consideration. To cope with these subjects, various kinds of researches have been made with respect to the technology to form a semiconductor thin film crystal on various insulating substrates (for example, SOI (Silicon on Insulator) technology) and semiconductor devices using this technology.

Recently, a semiconductor device has been realized in which an active layer is formed on an amorphous insulating substrate such as $SiO_2$ or the like is particularly required for the purpose of application to a three-dimensional integrated circuit having a multilayer structure, plane liquid crystal display device, long line sensor, or the like. As a material to be used for such an active layer, for example, amorphous silicon, polycrystalline silicon, and silicon which was monocrystallized due to a melting recrystallization (hereinafter, this silicon is referred to as a "pseudo monocrystalline silicon") have been studied. In general, three states of amorphous, polycrystal, and pseudo monocrystal are determined by the forming temperature of the material. In the case of forming silicon on $SiO_2$, it becomes amorphous at temperatures below a crystallization temperature $T_c$ (about 500° C.), pseudo monocrystal at temperatures above a melting point $T_m$ (1420° C.), and polycrystal at temperatures within a temperature range from about the crystallization temperature $T_c$ to the melting point $T_m$.

After a semiconductor layer is first deposited on an insulating substrate, it is heated to temperatures above the melting point $T_m$ and then recrystallized due to a solidification cooling, thereby forming a pseudo monocrystalline semiconductor layer. Thus, the polycrystalline or monocrystalline semiconductor layer of large diameter particles is formed and active elements such as transistors and the like can be formed on this semiconductor layer. In the case where transistors were formed, its carrier mobility is hundreds of $cm^2/V \cdot sec$. This mobility is nearly equal to that of the transistors formed on a monocrystalline silicon.

However, according to such a method, in the case of recrystallizing the semiconductor layer deposited, the temperature needs to be set to a high temperature above the melting point $T_m$ (about 1420° C. in the case of silicon), so that there are the problems such that the semiconductor layer is softened or in the worst case, the substrate itself is fused.

On the other hand, in the case of manufacturing an integrated circuit having a multilayer structure such as a three-dimensional integrated circuit or the like, according to a method whereby the heat treatment at such a high temperature is necessary, there is also the problem such that the impurity profiles of the elements which have already been formed in the lower layer portion are changed due to the high temperature, so that it is difficult to realize desired characteristics.

On the contrary, a low pressure chemical vapor phase (LPCVD) method, an MBE method, and the like have been known as methods of forming a semiconductor layer at relatively low temperatures below the melting point $T_m$. In this case, an amorphous or polycrstalline semiconductor layer is formed as mentioned above.

In the case of the amorphous semiconductor layer, however, since the long distance order of the crystal structure is lacking, a carrier mobility of transistors formed on this layer is below 1 $cm^2/V \cdot sec$. Thus, high speed operation characteristics cannot be realized.

On the other hand, in the case of the polycrystalline semiconductor layer, because of the diffusion of carriers mainly due to the crystal grain boundary, a carrier mobility of transistors formed on this layer is less than 10 $cm^2/V \cdot sec$. Therefore, this semiconductor layer is still insufficient when it is used as an active element for various kinds of devices.

SUMMARY OF THE INVENTION

It is an object of the present invention to provide a semiconductor device in which high speed operation characteristics are improved compared to those of the conventional devices.

Another object of the invention is to provide a semiconductor device which can be manufactured at a lower temperature and which has a higher carrier mobility as compared with those of the conventional device.

Still another object of the invention is to provide a semiconductor device which is constituted by a polycrystalline semiconductor film having large diameter particles and can operate at a high speed and in which an active layer whose carrier mobility is about 10 $cm^2/V \cdot sec$ is formed on an insulating substrate and to provide a method of manufacturing such a semiconductor device.

BRIEF DESCRIPTION OF THE DRAWINGS

FIG. 1 is a diagrammatical view showing a state of grain growth of a polycrystalline thin film in the solid phase;

FIG. 2 is a graph showing the relation between a film thickness h of the polycrystalline thin film and a diameter $d_n$ of particle grown due to a primary grain growth;

DETAILED DESCRIPTION OF PREFERRED EMBODIMENTS

Figure 3A:
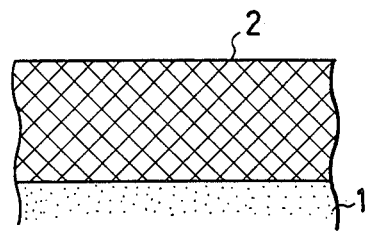
FIGS. 3A to 3D are diagrams of manufacturing processes showing an embodiment of a method of manufacturing a semiconductor device according to the present invention.

A growing method of enlarging polycrystalline grain will be first described.

FIG. 1 is a diagrammatical view showing a state of grain growth of a polycrystalline thin film in the solid phase. FIG. 2 is a graph showing the relation between a film thickness h of polycrystalline thin film and a diameter $d_n$ of particle grown due to a primary grain growth.

First, a temperature of an amorphous insulating substrate 1 is set to a value between the crystallization temperature $T_c$ and melting point $T_m$ of the polycrystalline thin film which is to be deposited. A thin film 2 having polycrystalline grain is deposited on the substrate 1 using an LPCVD method, a vacuum evaporation deposition method, or the like so as to have the thickness of only h. Subsequently, the polycrystalline grain is grown using heat treatment. This grain growth includes two kinds of phenomena called a primary grain growth and a secondary grain growth.

The primary grain growth is the process in which the diameter of crystal grain including a large amount of defects uniformly increases in the orientation which is unrelated to the surface of the substrate 1. The driving force in this case is generated because the defective energy and grain boundary energy before the growth decrease in association with the growth. However, in the primary grain growth, an enlargement of the diameter of crystal grain is limited due to the thickness h of polycrystalline thin film 2 as shown in an example of FIG. 2. Therefore, the diameter $d_n$ of crystal grain 3 after the primary grain growth can be substantially determined by setting the film thickness h.

The secondary grain growth is the phenomenon which appears under the conditions in the case where the film thickness h is so thin to be below 1000 Å or where a large amount of impurities are added into the polycrystalline thin film 2, or the like. First, crystal grain 3 is grown due to the primary grain growth and thereafter it is subjected to a heat treatment at temperatures below the melting point $T_m$. Thus, crystal grain 4 having a diameter $d_s$ which is hundreds of times as large as the diameter $d_n$ of crystal grain is grown and at the same time, its surface orientation becomes constant. This is because since the film thickness becomes extremely thin, a ratio of the surface area per volume of the crystal grain increases, so that the crystal grain having a surface orientation such that the surface energy is minimized grows so as to absorb the other crystal grain.

The polycrystalline film having large diameter crystal grain can be formed using such a grain growth due to low-temperature processes. An embodiment of the present invention will now be described in detail hereinbelow with reference to the drawings.

FIGS. 3A to 3D are diagrams of manufacturing processes showing an embodiment of a method of manufacturing a semiconductor device according to the present invention. In this embodiment, the primary grain growth is used as a method of forming the polycrystalline film of large diameter particle.

First, the polycrystalline film 2 of silicon or the like is deposited onto the amorphous insulating substrate 1 of $SiO_2$ or the like due to an LPCVD method or vacuum evaporation deposition method so as to have a thickness of about 10 μm. In this case, a temperature of the substrate 1 is held at a value above the crystallization temperature $T_c$ (400° to 500° C.), for example, within a range of 600° to 800° C. The diameter of crystal grain of the polycrystalline film 2 which is formed lies within a range of hundreds of Å to thousands of Å (FIG. 3A).

Figure 3B:
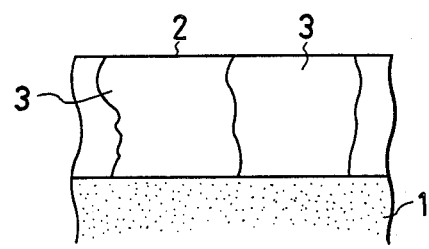

Next, the heat treatment is executed in the ambient atmosphere of $N_2$ gas or the like at temperatures below the melting point $T_m$ (1420° C.), e.g., within a range of 1100 to 1300° C. Due to this, the primary grain growth occurs and the crystal grain 3 having a large diameter which is nearly the same as the thickness (10 μm) of polycrystalline film 2 is grown. As already mentioned above, a diameter of crystal grain 3 can be arbitrarily decided due to a thickness of polycrystalline film 2 (FIG. 3B).

Figure 3C:
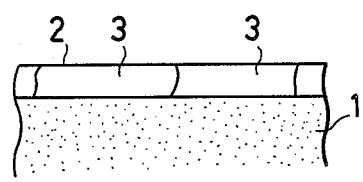

Subsequently, the polycrystalline film 2 having large diameter crystal grain is thinned due to wet etching, reactive ion etching, or the like so as to have a thickness suitable to form a transistor of a size below 0.5 μm (FIG. 3C).

Figure 3D:
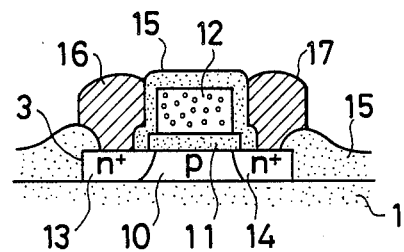

Then, a MOS transistor is formed using the thin polycrystalline film 2 as an active layer due to ordinary manufacturing processes. First, p type impurities are doped into the polycrystalline film 2 and the film 2 is etched to obtain island shapes. Then, a gate electrode 12 of polycrystalline silicon is formed through a gate oxide film 11 on a p region 10 in which n channel regions are formed. Next, an n+ source region 13 and an n+ drain region 14 are formed in a self-alignment manner using the gate electrode 12 as a mask. The whole surface is covered by an oxide film 15 and opening portions are formed in the electrode portions and metal is evaporation deposited into these opening portions, thereby forming a source electrode 16 and a drain electrode 17 (FIG. 3D).

According to the MOS transistor produced as described above, the good operation characteristics such that the electron mobility lies within a range of tens to hundreds of $cm^2/V \cdot sec$ were obtained.

A practical example will now be shown hereinbelow.

The $SiO_2$ film 1 of the thickness of 0.1 μm is grown on an Si wafer due to thermal oxidation. The polycrystalline silicon film 2 having the thickness of 10 μm is formed on the film 1 due to a CVD method using $SiH_4$ as a material gas. In this case, the temperature of the substrate was set to 700° C. (refer to FIG. 3A).

Next, the heat treatment is performed at 1100° C. for five to ten hours in the ambient atmosphere of $N_2$ and the polycrystalline silicon film 2 is grown due to the primary grain growth so as to have a particle diameter which is nearly the same as the film thickness (10 μm) (refer to FIG. 3B).

Next, an oxide film having the thickness of 9.5 μm is formed due to high pressure oxidation. By removing this oxide film by use of hydrogen fluoride HF, the polycrystalline silicon film 2 having a large particle diameter is made thinner to have the thickness of 0.5 μm (refer to FIG. 3C).

The thin polycrystalline silicon film 2 is formed into islands due to a reactive ion etching using ($SF_6+CCl_2S_2$) gases, thereby electrically isolating the portions from the other portions to form a transistor. Subsequently, gate oxide film ($SiO_2$) 11 having the thickness of 0.05 μm is formed due to a thermal oxidation. Thereafter, the polycrystalline silicon is deposited at 600° C. due to an LPCVD method so as to have the thickness of 0.3 μm and patterned to form the gate electrode 12. Next, the source and drain regions 13 and 14 and the source and drain electrodes 16 and 17 are formed due to ordinary diffusion processes and lithography processes. Finally, an SiN film is deposited as a passivation film due to a plasma CVD method, thereby forming the MOS transistor. According to the MOS transistor manufactured in this way, good operation characteristics, such that the electron mobility is about 10 cm$^2$/V·sec were derived.

If the polycrystalline film 2 which is deposited onto the amorphous insulating substrate 1 is formed so as to have a very thin thickness below 1000 Å, the polycrystalline film having further large particle diameters can be formed by use of the secondary grain growth. A field effect transistor using such a polycrystalline film as an active layer may be manufactured as another embodiment of the invention due to the processes similar to the above.

Figure 4:
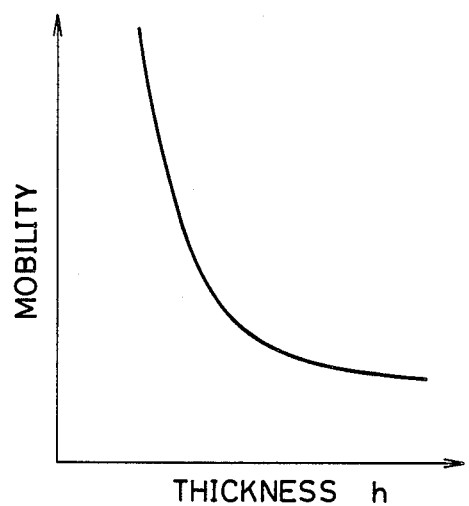
FIG. 4 is a graph showing the relation between the carrier mobility and the film thickness of the polycrystalline film which were obtained using another embodiment of the invention.

FIG. 4 is a graph showing the relation between the electron mobility and the thickness of polycrystalline film which were obtained using another embodiment of the invention.

As shown in this graph, it will be appreciated that with a decrease in film thickness h, the electron mobility increases. This is because, the grain boundary interval of the polycrystalline film increases as the particle diameter increases, so that the diffusion of the carriers running in the polycrystalline film at the grain boundary is reduced.

As described in detail above, the semiconductor device according to the invention can be sufficiently used as an active element having the high speed operation characteristics since the carrier mobility is above 10 cm$^2$/V·sec in spite of the fact that its active layer is the polycrystalline semiconductor.

On the other hand, the method of manufacturing the semiconductor device according to the invention merely needs requires the heat treatment at temperatures below the melting point. Therefore, the semiconductor device can be manufactured using processes at low temperatures. Consequently, this method is suitable to manufacture an integrated circuit having a multilayer structure such as a three-dimensional integrated circuit or the like, a large-area or long active element array, and the like.

What I claim is:

1. A method of manufacturing a semiconductor device having a semiconductor film carrier mobility not lower than 10 cm$^2$/V·sec, comprising the steps of:
    (1) heating a non-crystalline insulating substrate to maintain the substrate at a temperature above a crystallization temperature of the semiconductor film to be formed;
    (2) depositing a polycrystalline semiconductor film of sufficient thickness on the substrate while it is maintained at the temperature ($T_1$);
    (3) subjecting the semiconductor film to heat treatment at a temperature ($T_2$) not higher than the melting point of the semiconductor film, thereby enlarging its crystalline grain size by a predetermined amount; and
    (4) removing a surface portion of the semiconductor film whose crystalline grain size is enlarged to make the semiconductor film into a thin film with a predetermined thickness.

* * * * *

UNITED STATES PATENT AND TRADEMARK OFFICE
CERTIFICATE OF CORRECTION

PATENT NO. : 4,868,140
DATED : September 19, 1989
INVENTOR(S) : TAKAO YONEHARA

Page 1 of 2

It is certified that error appears in the above-identified patent and that said Letters Patent is hereby corrected as shown below:

ON THE TITLE PAGE

AT [56] REFERENCES CITED

Other Publications, "Karmins et al., IEEE Trans. on Elec. Dev., vol. Ed-27, No. 1, Jan. 1980, "A Monolithic. . .Polysilicon", pp. 290-293." should be deleted.

COLUMN 1

Line 22, "the" (second occurrence) should be deleted.
Line 58, "were" should read --are--.

COLUMN 3

Line 58, "particle." should read --crystal grain.--.

COLUMN 4

Line 42, "the" should be deleted.
Line 59, "a" should be deleted.

COLUMN 5

Line 3, "10 $CM^2$/V•sec" should read --10 $CM^2$/V•sec,--.

UNITED STATES PATENT AND TRADEMARK OFFICE
CERTIFICATE OF CORRECTION

PATENT NO. : 4,868,140
DATED : September 19, 1989
INVENTOR(S) : TAKAO YONEHARA

It is certified that error appears in the above-identified patent and that said Letters Patent is hereby corrected as shown below:

COLUMN 6

Line 3, "needs" should be deleted.
Line 17, "crystallization temperature" should read --crystallization temperature ($T_1$)--.

Signed and Sealed this

Twenty-eighth Day of January, 1992

Attest:

HARRY F. MANBECK, JR.

Attesting Officer

Commissioner of Patents and Trademarks